United States Patent
Sako

(10) Patent No.: US 11,568,939 B2
(45) Date of Patent: Jan. 31, 2023

(54) SEMICONDUCTOR STORAGE DEVICE

(71) Applicant: KIOXIA CORPORATION, Tokyo (JP)

(72) Inventor: Mario Sako, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 57 days.

(21) Appl. No.: 17/183,805

(22) Filed: Feb. 24, 2021

(65) Prior Publication Data

US 2021/0312992 A1 Oct. 7, 2021

(30) Foreign Application Priority Data

Apr. 2, 2020 (JP) .............................. JP2020-066685

(51) Int. Cl.
*G11C 7/00* (2006.01)
*G11C 16/26* (2006.01)
*G11C 16/04* (2006.01)

(52) U.S. Cl.
CPC .......... *G11C 16/26* (2013.01); *G11C 16/0483* (2013.01)

(58) Field of Classification Search
CPC ..... G11C 11/4091; G11C 7/065; G11C 7/062; G11C 7/06; G11C 7/067
USPC ........................................... 365/207, 189.15
See application file for complete search history.

(56) References Cited

U.S. PATENT DOCUMENTS

| 6,226,212 B1 * | 5/2001 | Sakamoto ........... G11C 11/5621 365/207 |
| 8,514,636 B2 * | 8/2013 | Kamata ................ G11C 16/10 365/189.05 |
| 2015/0262690 A1 | 9/2015 | Maeda |
| 2016/0055916 A1 | 2/2016 | Louie et al. |
| 2016/0141024 A1 | 5/2016 | Lee |
| 2021/0090666 A1 | 3/2021 | Sako et al. |

OTHER PUBLICATIONS

U.S. Appl. No. 17/008,209.

* cited by examiner

*Primary Examiner* — Son T Dinh
(74) *Attorney, Agent, or Firm* — Kim & Stewart LLP

(57) ABSTRACT

A semiconductor storage device includes a bit line, a memory cell transistor electrically connected to the bit line, and a sense amplifier that reads data from the memory cell transistor via the bit line. During an operation of determining first data and second data, while continuously applying a first voltage to a gate of the memory cell transistor, the sense amplifier first determines the first data based upon a second voltage, and then determines the second data based upon a third voltage lower than the second voltage.

18 Claims, 8 Drawing Sheets

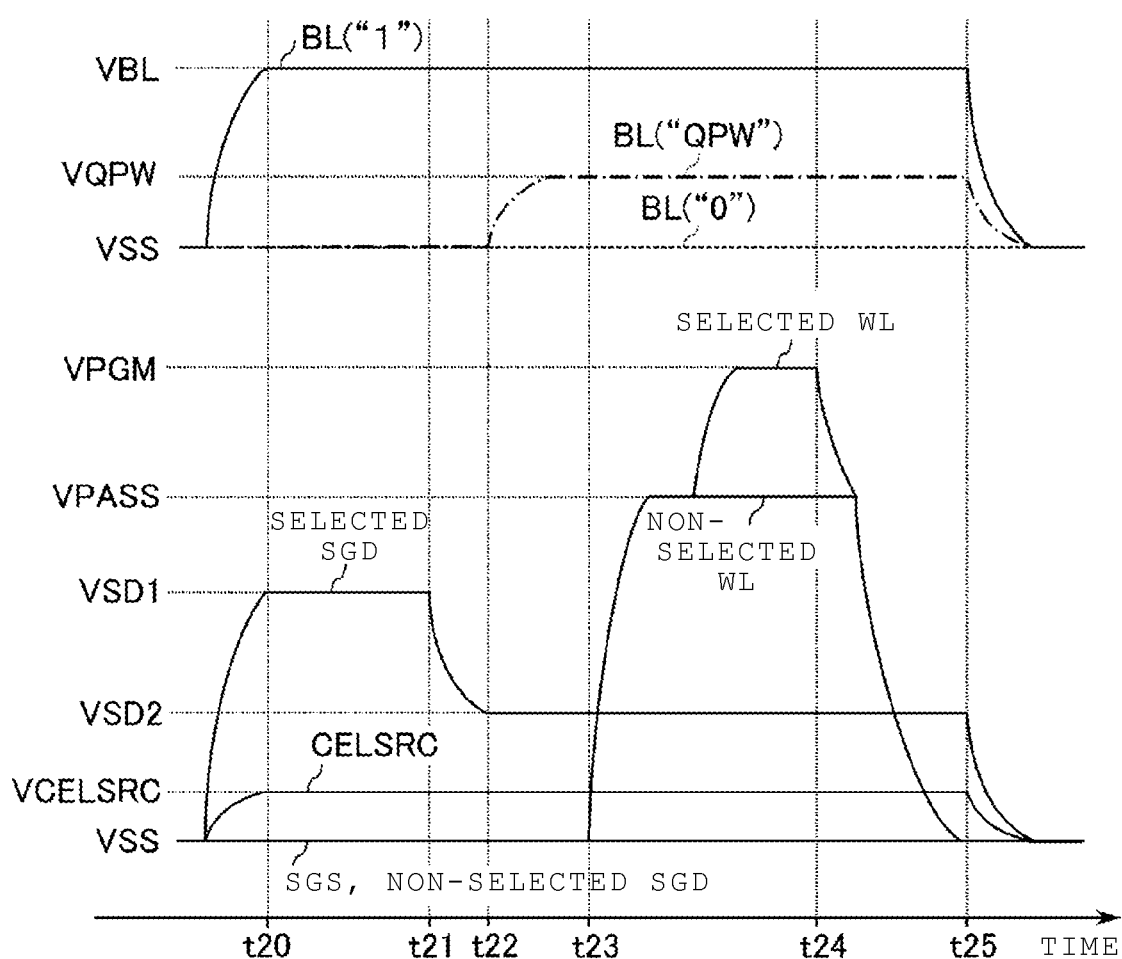

SEMICONDUCTOR STORAGE DEVICE

CROSS-REFERENCE TO RELATED APPLICATION

This application is based upon and claims the benefit of priority from Japanese Patent Application No. 2020-066685, filed Apr. 2, 2020, the entire contents of which are incorporated herein by reference.

FIELD

Embodiments described herein relate generally to a semiconductor storage device.

BACKGROUND

A NAND type flash memory is known as one type of a semiconductor storage device.

DESCRIPTION OF THE DRAWINGS

FIG. 9 is a timing chart illustrating a voltage of various wirings during the program operation using the semiconductor storage device according to the embodiment.

DETAILED DESCRIPTION

Embodiments provide a semiconductor storage device capable of improving a read speed, e.g., during a program-verify operation.

In general, according to one embodiment, a semiconductor storage device includes a bit line, a memory cell transistor electrically connected to the bit line, and a sense amplifier that reads data from the memory cell transistor via the bit line. During an operation of determining first data and second data, while continuously applying a first voltage to a gate of the memory cell transistor, the sense amplifier first determines the first data based upon a second voltage, and then determines the second data based upon a third voltage lower than the second voltage.

Hereinafter, embodiments will be described with reference to the drawings. In the description thereof, the same component will be denoted by a common reference sign throughout the drawings.

1. Embodiment

A semiconductor storage device according to an embodiment will be described. Hereinafter, a NAND type flash memory will be described as an example of the semiconductor storage device.

1.1 Configuration

1.1.1 Overall Configuration

Figure 1:
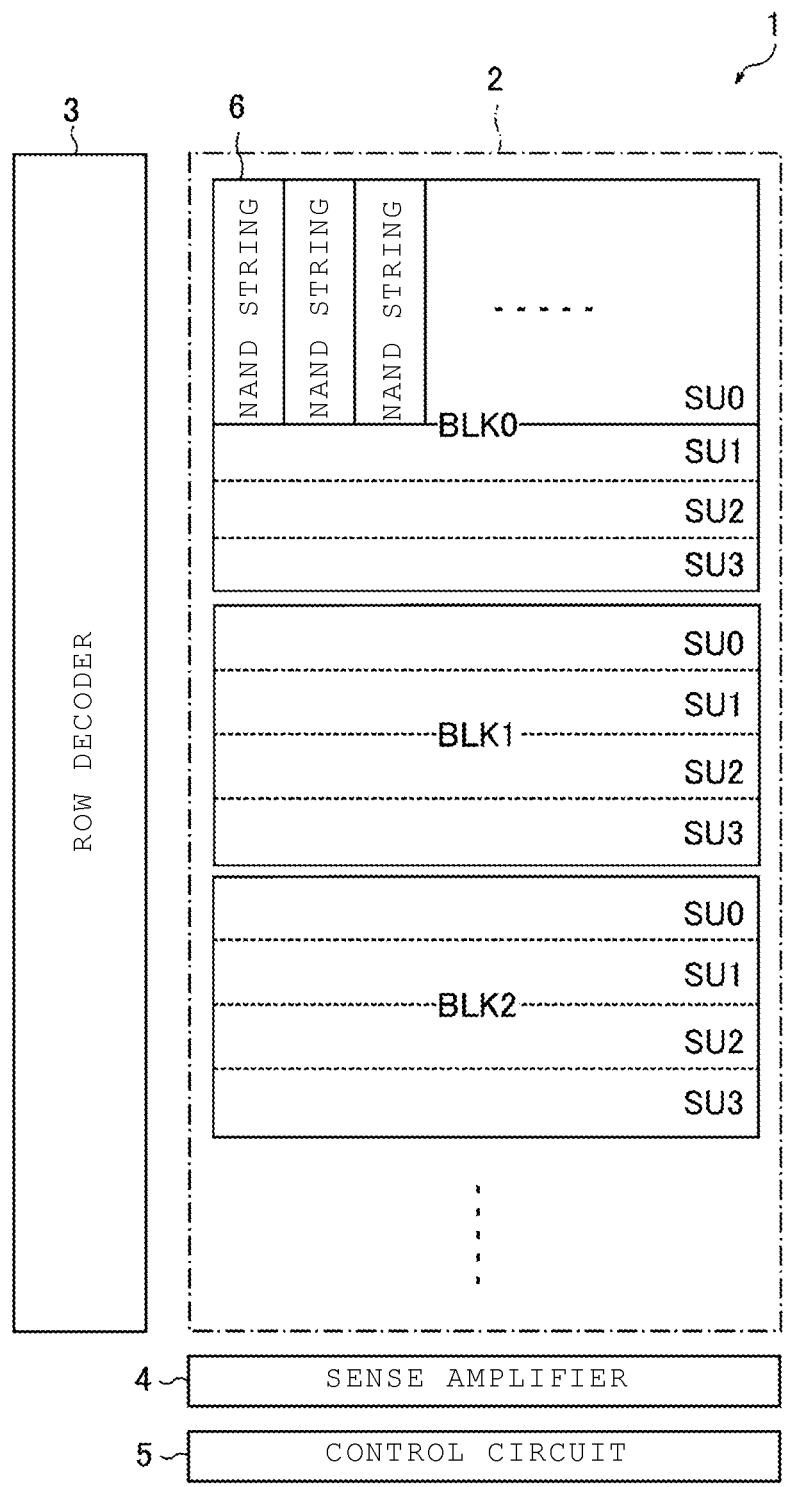
FIG. 1 is a block diagram of a semiconductor storage device according to an embodiment.

First, an overall configuration of the semiconductor storage device according to the embodiment will be described with reference to FIG. 1. FIG. 1 is a block diagram of the NAND type flash memory according to the embodiment.

As illustrated in the drawing, a NAND type flash memory 1 includes a memory cell array 2, a row decoder 3, a sense amplifier 4, and a control circuit 5.

The memory cell array 2 includes a plurality of blocks BLK (BLK0, BLK1, BLK2, . . . ) including non-volatile memory cell transistors associated with a row and a column. Each block BLK includes, for example, four string units SU (SU0 to SU3). Each string unit SU includes a plurality of NAND strings 6. The number of blocks in the memory cell array 2 and the number of string units in the block are freely selected. Details of the memory cell array 2 will be described later.

The row decoder 3 decodes a row address, selects any one of the blocks BLK based upon a decode result, and further selects any one of the string units SU. Next, a required voltage is outputted to the block BLK. The row address is provided, for example, from a memory controller that controls the NAND type flash memory 1.

The sense amplifier 4 senses a threshold voltage of the memory cell transistor, which is a target to be read, in the memory cell array 2 during a read operation of data. Next, a sensed result is outputted to the memory controller as read data. During a write operation of the data, write data received from an external memory controller is transferred to the memory cell array 2.

The control circuit 5 controls an overall operation of the NAND type flash memory 1.

The NAND type flash memory 1 having the above-described configuration is connected to the external memory controller which is not illustrated via a NAND interface. Signals transmitted and received between the memory controller and the NAND type flash memory 1 include a chip enable signal /CE, a command latch enable signal CLE, an address latch enable signal ALE, a write enable signal /WE, a read enable signal /RE, a write protect signal /WP, a ready/busy signal /RB, and an input and output signal I/O <7:0>.

The signal /CE is a signal for enabling the NAND type flash memory 1. The signal CLE notifies the NAND type flash memory 1 that the signal I/O <7:0> supplied to the NAND type flash memory 1 is a command while the signal CLE is at an "H (High)" state. The signal ALE notifies the NAND type flash memory 1 that the signal I/O <7:0> supplied to the NAND type flash memory 1 is an address while the signal ALE is at the "H (High)" state. The signal /WE instructs that the signal I/O <7:0> supplied to the NAND type flash memory 1 is to be fetched into the NAND type flash memory 1 while the signal /WE is at an "L (Low)" state. The signal /RE instructs the NAND type flash memory 1 to output the signal I/O <7:0>. The signal /WP instructs the NAND type flash memory 1 to prohibit data from being written or erased. The signal /RB indicates whether the NAND type flash memory 1 is in a ready state (a state in which a command from the outside can be received) or in a busy state (a state in which the command from the outside cannot be received). The signal I/O <7:0> is, for example, an 8-bit signal. The signal I/O <7:0> contains data transmitted and received between the memory controller and the NAND type flash memory 1, and includes a command CMD, an address ADD, and a data DAT. The data DAT includes the write data and the read data. The memory controller controls the NAND type flash memory 1 by using the above-described signals.

1.1.2 Memory Cell Array

Figure 2:
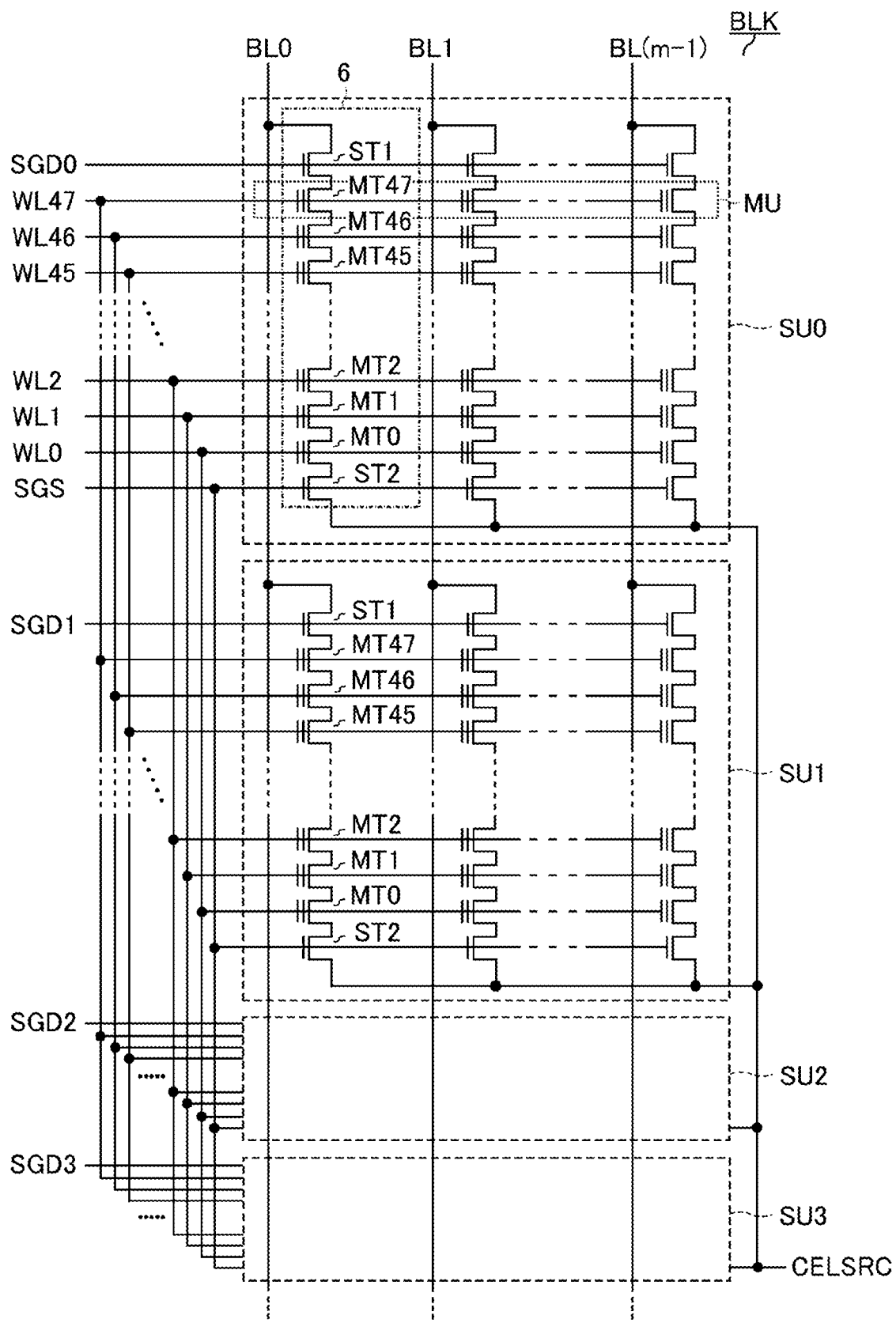
FIG. 2 is a circuit diagram of a memory cell array in the semiconductor storage device according to the embodiment.

Next, a configuration of the memory cell array 2 will be described with reference to FIG. 2. FIG. 2 illustrates one of the blocks BLK in the memory cell array 2, and other blocks BLK in the memory cell array 2 also have the same configuration. As described above, the block BLK includes, for example, four string units SU, and each string unit SU includes a plurality of NAND strings 6.

As illustrated in the drawing, each of the NAND strings 6 includes, for example, forty-eight memory cell transistors MT (MT0 to MT47) and select transistors ST1 and ST2. The memory cell transistor MT includes a control gate and a charge storage layer, and stores data in a non-volatile manner. The memory cell transistors MT are connected to each other in series between a source of the select transistor ST1 and a drain of the select transistor ST2. The number of memory cell transistors MT in each NAND string 6 is not limited to forty-eight, and may be eight, sixteen, thirty-two, sixty-four, ninety-six, and one hundred twenty-eight, and the number thereof is not limited. The memory cell transistor MT includes a layered gate including the control gate and the charge storage layer. The respective memory cell transistors MT are connected to each other in series between the select transistors ST1 and ST2.

Gates of the select transistors ST1 in the respective string units SU0 to SU3 are respectively connected to select gate lines SGD0 to SGD3. On the other hand, gates of the select transistors ST2 in the respective string units SU0 to SU3 are commonly connected to, for example, a select gate line SGS. Alternatively, the gates of the select transistors ST2 may be connected to different select gate lines SGS0 to SGS3 for each string unit. The control gates of the memory cell transistors MT0 to MT47 in the same block BLK are commonly connected to word lines WL0 to WL47, respectively.

A drain of the select transistor ST1 of each NAND string 6 in the string unit SU is connected to different bit lines BL (BL0 to BL (m−1), where m is a natural number of 2 or more). The bit line BL commonly connects one NAND string 6 in each string unit SU across the plurality of blocks BLK. Sources of the plurality of select transistors ST2 are commonly connected to a source line CELSRC.

That is, the string unit SU is an aggregate of the NAND strings 6 connected to the different bit lines BL and connected to the same select gate line SGD. The block BLK is an aggregate of a plurality of string units SU having the common word line WL. The memory cell array 2 is an aggregate of a plurality of blocks BLK having the common bit line BL.

For example, data erasure is performed collectively with respect to the memory cell transistors MT in the same block BLK. On the other hand, reading and writing of data are collectively performed with respect to a plurality of memory cell transistors MT commonly connected to any one of the word lines WL in any one of the string units SU of any one of the blocks BLK. A set of the memory cell transistors MT sharing the word line WL in one string unit SU is referred to as, for example, a memory cell unit MU. That is, the memory cell unit MU is a set of the memory cell transistors MT capable of collectively executing the write operation or the read operation.

A set of 1-bit data stored in each of the plurality of memory cell transistors MT in the memory cell unit MU is defined as a "page". One memory cell transistor MT can store, for example, 2-bit data. The 2-bit data is referred to as a lower bit and an upper bit respectively from the lower bit. In this case, the memory cell unit MU stores data of two pages, a group of the lower bits stored in the respective memory cell transistors MT in the memory cell unit MU is referred to as a lower page, and a group of the upper bits is referred to as an upper page.

1.1.3. Sense Amplifier

Figure 3:
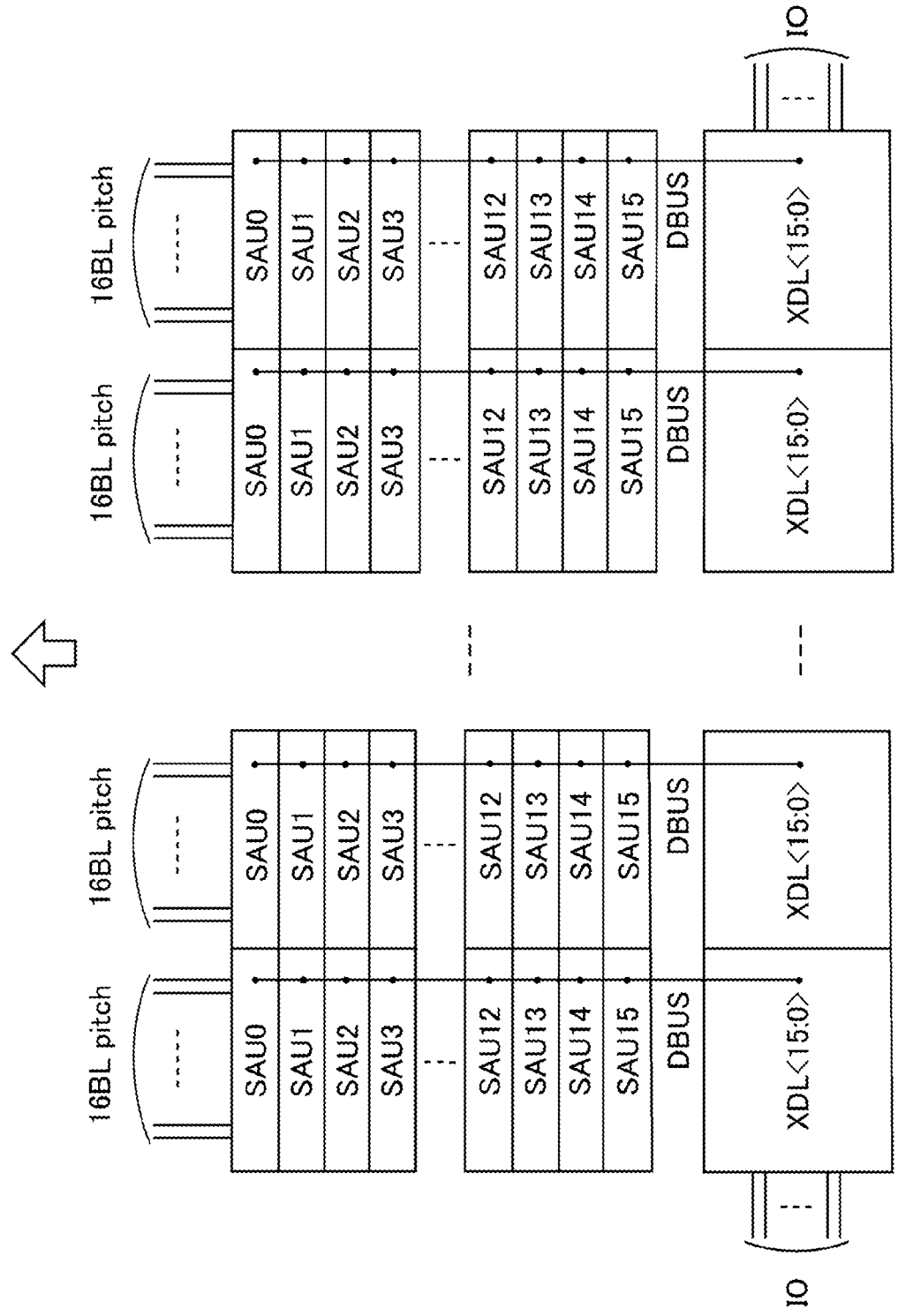
FIG. 3 is a block diagram of a sense amplifier in the semiconductor storage device according to the embodiment.

Next, a configuration of the sense amplifier 4 will be described with reference to FIG. 3. FIG. 3 is a block diagram of the sense amplifier 4 in the semiconductor storage device according to the embodiment.

1.1.3.1 Overall Configuration

As illustrated in the drawing, the sense amplifier 4 includes a plurality of sense amplifier units SAU and a plurality of latch circuits XDL.

For example, the sense amplifier unit SAU is provided for each bit line BL, senses a threshold voltage of the memory cell transistor MT via the corresponding bit line BL in the read operation, and stores the sensed result as the read data. In the write operation, the sense amplifier unit SAU controls a voltage of the corresponding bit line BL according to the write data. For example, sixteen sense amplifier units SAU0 to SAU15 are commonly connected to one bus DBUS. The number of sense amplifier units SAU connected to the one bus DBUS may be set to any number.

The latch circuit XDL is provided for each sense amplifier unit SAU, and temporarily stores data related to the corresponding bit line BL. Sixteen latch circuits XDL <15:0> respectively corresponding to the sense amplifier units SAU0 to SAU15 are commonly connected to the one bus DBUS. Each latch circuit XDL is connected to a data line IO. The latch circuit XDL is used for transmitting and receiving the data between the sense amplifier unit SAU and the outside via the bus DBUS and the data line IO. That is, for example, the data received from the external memory controller is first stored in the latch circuit XDL via the data line IO, and then transferred to the sense amplifier unit SAU via the bus DBUS. The same is also true in reverse. FIG. 3 illustrates an example in which sixteen latch circuits XDL <15:0> are commonly connected to the one bus DBUS, and each set of the sixteen latch circuits XDL <15:0> is connected to one of the sixteen buses DBUS.

1.1.3.2 Sense Amplifier Unit

Figure 4:
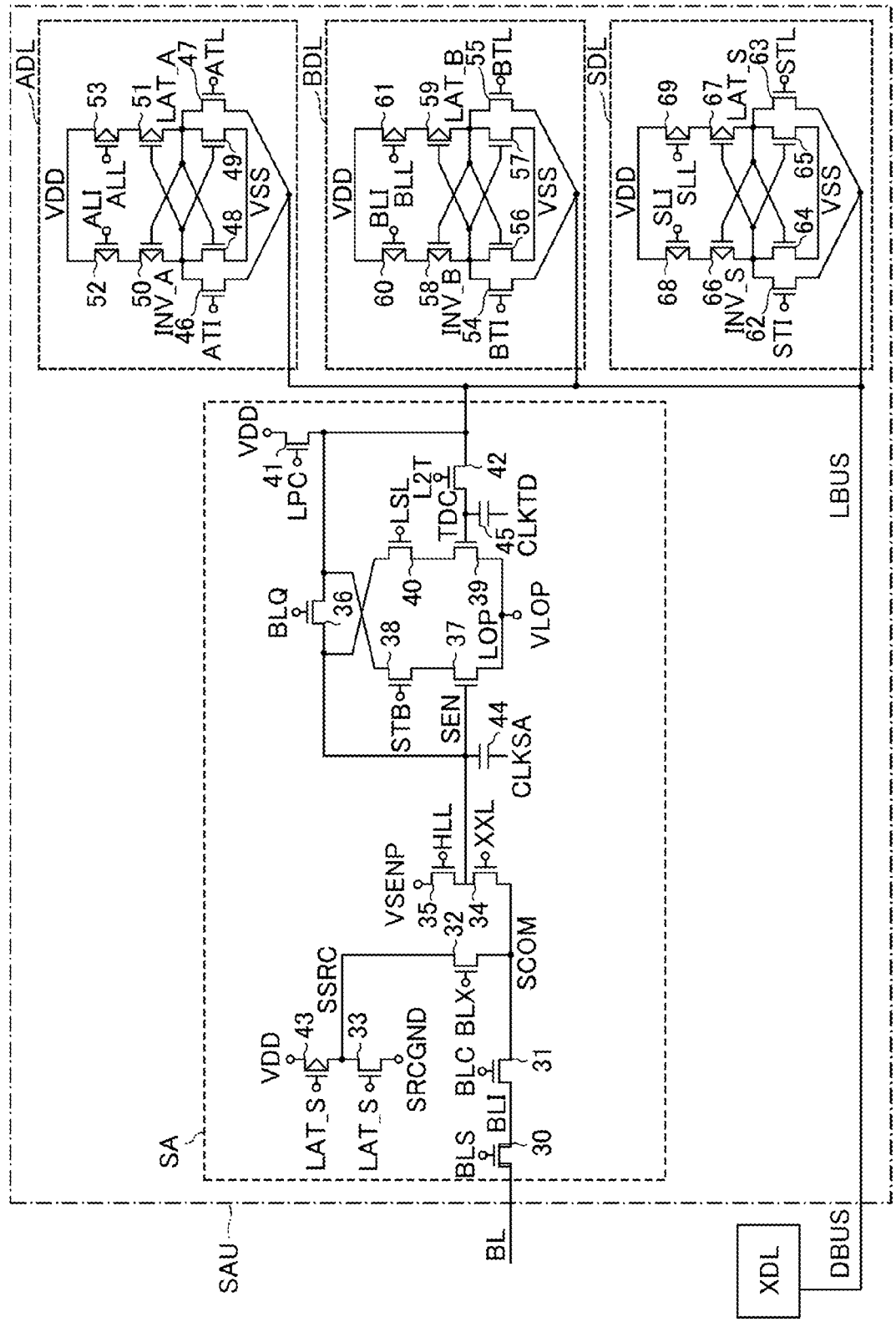
FIG. 4 is a circuit diagram of the sense amplifier in the semiconductor storage device according to the embodiment.

Next, a configuration of the sense amplifier unit SAU will be described with reference to FIG. 4. FIG. 4 is a circuit diagram of the sense amplifier unit SAU in the semiconductor storage device according to the embodiment.

As illustrated in FIG. 4, the sense amplifier unit SAU includes a sense circuit SA and, for example, three latch circuits (SDL, ADL, and BDL).

The sense circuit SA senses a threshold voltage of the memory cell transistor MT based upon current flowing through the bit line BL in the read operation, and applies a voltage to the bit line BL according to the write data in the write operation. That is, the sense circuit SA is a module that directly controls the bit line BL, and performs an AND operation or an OR operation using the data in the latch circuits SDL, ADL, and BDL.

Next, a circuit of the sense circuit SA will be described in detail. In the following description, one of the source and drain of the transistor is referred to as "one end of a current path" and the other one of the source and drain thereof is referred to as "the other end of the current path".

The sense circuit SA includes a high breakdown voltage n-channel MOS transistor 30, low breakdown voltage n-channel MOS transistors 31 to 42, a low breakdown voltage p-channel MOS transistor 43, and capacitive elements 44 and 45.

A signal BLS is inputted to a gate of the transistor 30, one end of a current path of the transistor 30 is connected to a corresponding bit line BL, and the other end of the current path thereof is connected to a node BLI. A signal BLC is inputted to a gate of the transistor 31, one end of a current path of the transistor 31 is connected to the node BLI, and the other end of the current path thereof is connected to a node SCOM. The transistor 31 is used for clamping the corresponding bit line BL to a voltage in accordance with the signal BLC.

A signal BLX is inputted to a gate of the transistor 32, one end of a current path of the transistor 32 is connected to the node SCOM, and the other end of the current path thereof is connected to a node SSRC. A gate of the transistor 33 is connected to a node LAT_S, one end of a current path of the transistor 33 is connected to the node SSRC, and the other end of the current path thereof is connected to a node SRCGND. For example, a ground voltage VSS is applied to the node SRCGND. A gate of the transistor 43 is connected to the node LAT_S, a power supply voltage VDD is applied to one end of a current path of the transistor 43, and the other end of the current path thereof is connected to the node SSRC. A signal XXL is inputted to a gate of the transistor 34, one end of a current path of the transistor 34 is connected to the node SCOM, and the other end of the current path thereof is connected to a node SEN. A signal HLL is inputted to a gate of the transistor 35, a voltage VSENP is applied to one end of a current path of the transistor 35, and the other end of the current path thereof is connected to the node SEN.

One electrode of the capacitive element 44 is connected to the node SEN, and a clock CLKSA is inputted to the other electrode thereof.

A gate of the transistor 37 is connected to the node SEN, one end of a current path of the transistor 37 is connected to one end of a current path of the transistor 38, and the other end of the current path thereof is connected to a node LOP. A signal STB is inputted to a gate of the transistor 38, and the other end of the current path thereof is connected to a bus LBUS. A signal BLQ is inputted to a gate of the transistor 36, one end of a current path of the transistor 36 is connected to the node SEN, and the other end of the current path thereof is connected to the bus LBUS. A gate of the transistor 39 is connected to a node TDC, one end of a current path of the transistor 39 is connected to one end of a current path of the transistor 40, and the other end of the current path thereof is connected to the node LOP together with the other end of the current path of the transistor 37. A signal LSL is inputted to a gate of the transistor 40, and the other end of the current path thereof is connected to the node SEN.

A power supply voltage VLOP is applied to the node LOP.

One electrode of the capacitive element 45 is connected to the node TDC, and a clock CLKTD is inputted to the other electrode thereof.

A signal L2T is inputted to a gate of the transistor 42, one end of a current path of the transistor 42 is connected to the node TDC, and the other end of the current path thereof is connected to the bus LBUS.

A signal LPC is inputted to a gate of the transistor 41, one end of a current path of the transistor 41 is connected to the bus LBUS, and a power supply voltage VDD is applied to the other end of the current path thereof. By allowing the transistor 41 to go into an ON state and transferring the voltage VDD to the bus LBUS, the bus LBUS is precharged.

The latch circuits SDL, ADL, and BDL temporarily store data. In the write operation of data, the sense circuit SA controls the bit line BL according to the data stored in the latch circuit SDL. For example, other latch circuits ADL and BDL are used for temporarily storing the data of each bit when individual memory cell transistors store the data of two bits or more. The number of latch circuits may be freely set, and is set according to, for example, an amount of data that can be stored in the memory cell transistor (the number of bits).

The latch circuit SDL includes low breakdown voltage n-channel MOS transistors 62 to 65 and low breakdown voltage p-channel MOS transistors 66 to 69.

A signal STI is inputted to a gate of the transistor 62, one end of a current path of the transistor 62 is connected to the bus LBUS, and the other end of the current path thereof is connected to a node INV_S. A signal STL is inputted to a gate of the transistor 63, one end of a current path of the transistor 63 is connected to the bus LBUS, and the other end of the current path thereof is connected to a node LAT_S. A gate of transistor 64 is connected to the node LAT_S, one end of a current path of transistor 64 is grounded, and the other end of the current path thereof is connected to the node INV_S. A gate of the transistor 65 is connected to the node INV_S, one end of a current path of the transistor 65 is grounded, and the other end of the current path thereof is connected to the node LAT_S. A gate of the transistor 66 is connected to the node LAT_S, and one end of a current path of the transistor 66 is connected to the node INV_S. A gate of the transistor 67 is connected to the node INV_S, and one end of a current path of the transistor 67 is connected to the node LAT_S. A signal SLI is inputted to a gate of the transistor 68, one end of a current path of the transistor 68 is connected to the other end of the current path of the transistor 66, and a power supply voltage VDD is applied to the other end of the current path thereof. A signal SLL is inputted to a gate of the transistor 69, one end of a current path of the transistor 69 is connected to the other end of the current path of the transistor 67, and the power supply voltage VDD is applied to the other end of the current path thereof.

In the latch circuit SDL, the transistors 65 and 67 form a first inverter, and the transistors 64 and 66 form a second inverter. An output of the first inverter and an input of the second inverter (the node LAT_S) are connected to the bus LBUS via the transistor 63 for data transfer, and an input of the first inverter and an output of the second inverter (the node INV_S) are connected to the bus LBUS via the transistor 62 for data transfer. The latch circuit SDL stores the data with the node LAT_S, and stores the inverted data with the node INV_S.

Since the latch circuits ADL and BDL have the same configuration as that of the latch circuit SDL, the description thereof will be omitted, and the reference sign and signal name of each transistor will be described below in distinction from those of the latch circuit SDL as illustrated in FIG. 4. That is, transistors 46 to 53 in the latch circuit ADL and transistors 54 to 61 in the latch circuit BDL respectively correspond to the transistors 62 to 69 in the latch circuit SDL. Signals ATI and BTI, and signals ATL and BTL respectively correspond to the signals STI and STL, and signals ALI and BLI, and signals ALL and BLL respectively correspond to the signals SLI and SLL. In each sense amplifier unit SAU, the sense circuit SA and the three latch circuits SDL, ADL, and BDL are connected to each other by the bus LBUS so that data can be transmitted and received to and from each other.

The bus LBUS is connected to the bus DBUS via a bus switch which is not illustrated. The sense circuit SA and the latch circuit XDL are also connected by this bus switch.

Various signals in the sense amplifier unit SAU having the above-described configuration are given by, for example, the control circuit 5.

1.1.4 Threshold Voltage Distribution of Memory Cell Transistor

Next, an obtainable threshold voltage distribution of the memory cell transistor MT according to the embodiment will be described with reference to FIG. 5. Hereinafter, in the embodiment, a case in which the memory cell transistor MT can store quadruple data (2 bits) will be described, and the data that the memory cell transistor MT can store is not limited to the quadruple data. In the embodiment, the memory cell transistor MT may be capable of storing, for example, octal data (3 bits), and may be capable of storing binary data (1 bit) or data of any number of bits.

The threshold voltage of each memory cell transistor MT takes a value of any one of, for example, four discrete distributions. These four distributions are respectively referred to as an "Er" state, an "A" state, a "B" state, and a "C" state in an ascending order of the threshold voltage.

The "Er" state corresponds to, for example, an erased state of data. The threshold voltage in the "Er" state is smaller than a voltage VfyA and has a positive to negative value.

Each of the "A" to "C" states corresponds to a state in which a charge has been injected into a charge storage layer and the data has been written, and the threshold voltage in each distribution has, for example, a positive value. The threshold voltage in the "A" state is equal to or higher than the voltage VfyA and less than a voltage VfyB (here, VfyB>VfyA). The threshold voltage in the "B" state is equal to or higher than the voltage VfyB and less than a voltage VfyC (here, VfyC>VfyB). The threshold voltage in the "C" state is equal to or higher than the voltage VfyC and less than voltages VREAD and VPASS (VREAD (or VPASS) >VfyC). The VREAD and VPASS are voltages applied to a non-selected word line WL during the read operation of data and the write operation thereof, respectively.

As described above, each memory cell transistor MT can take any of four kinds of states by having any one of the four threshold voltage distributions. By assigning these states to "00" to "11" in binary notation, each memory cell transistor MT can store the 2-bit data.

Figure 5:
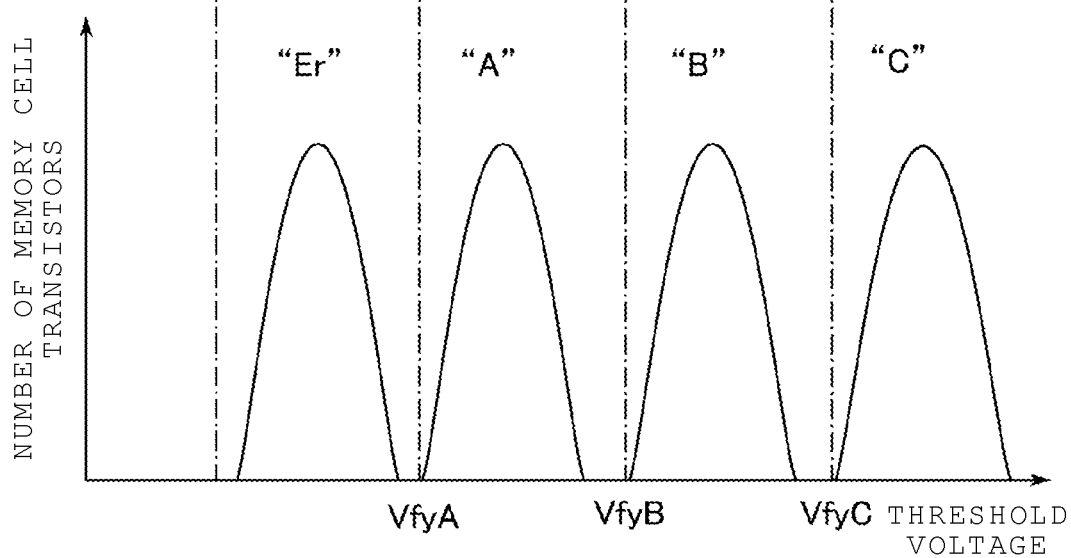
FIG. 5 is a threshold voltage distribution diagram of memory cell transistors in the semiconductor storage device according to the embodiment.

In FIG. 5, a case in which the four states are discrete is described as an example, and the case is, for example, an ideal state immediately after the data has been written. As time passes after data has been written, states adjacent to each other may overlap each other. For example, after the data has been written, an upper end of the "Er" state and a lower end of the "A" state may overlap each other due to disturbance. In such a case, the data is corrected by using, for example, an error checking and correcting (ECC) technology.

1.2 Regarding Write Operation

Next, a write operation according to the embodiment will be briefly described.

The write operation includes a program operation and a verification operation. The program operation is an operation of increasing the threshold voltage by injecting electrons into the charge storage layer (or maintaining the threshold voltage by prohibiting electrons from being injected thereinto). The verification operation is an operation of reading data after the program operation is performed, and of determining whether or not the threshold voltage of the memory cell transistor MT has reached a target voltage (hereinafter, also referred to as a target state). The NAND type flash memory 1 increases the threshold voltage of the memory cell transistor MT to the target state by repeating a combination of the program operation and the verification operation (hereinafter, referred to as a "program loop"). The target state may be set to, for example, the voltage VfyA, VfyB, or VfyC in FIG. 5.

1.2.1 Regarding Program Operation

First, an example of the program operation according to the embodiment will be described. Hereinafter, an operation of increasing the threshold voltage is referred to as a "0" program operation", and an operation of maintaining the threshold voltage is referred to as a "1" program operation" or a "write-protect (inhibit) operation".

In the embodiment, in the "0" program operation, either a first program condition in which an amount of increase in the threshold voltage is relatively large or a second program condition in which the amount of increase in the threshold voltage is smaller than that of the first program condition is applied, depending on a difference between the target state and the threshold voltage of the memory cell transistor MT.

For example, when it is determined that the threshold voltage of the memory cell transistor MT is sufficiently lower than the target state and does not reach the target state in the next program operation, the first program condition in which the amount of increase in the threshold voltage is relatively large is applied. On the other hand, when it is determined that the threshold voltage of the memory cell transistor MT is relatively close to the target state, and the threshold voltage thereof significantly exceeds the target state when the first program condition is applied to the next program operation, the second program condition is applied thereto.

Figure 6:
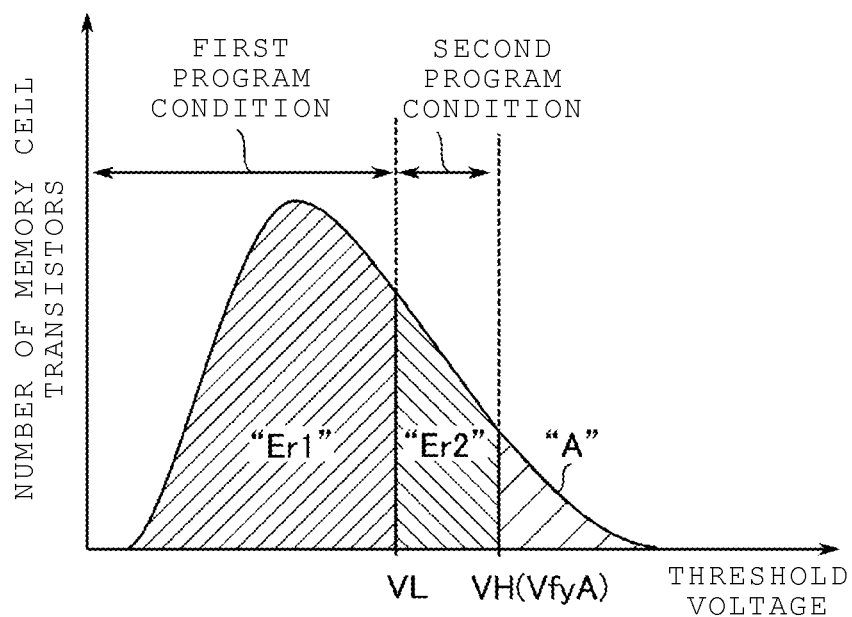
FIG. 6 is a diagram illustrating selection of a program operation in a write operation using the semiconductor storage device according to the embodiment.

FIG. 6 is a diagram illustrating the selection of the program operation. For the convenience of description, an example of FIG. 6 shows an example of a threshold voltage distribution while the memory cell transistor MT whose target state is the voltage VfyA is being written from the "Er" state to the "A" state.

As illustrated in FIG. 6, when the threshold voltage of the memory cell transistor MT is equal to or higher than a voltage VH (the voltage VfyA in FIG. 6) (in the "A" state in FIG. 6), the "1" program operation is applied to the memory cell transistor MT, and when the threshold voltage of the memory cell transistor MT is less than the voltage VH, the "0" program operation is applied thereto.

In order to determine which of the first program condition and the second program condition is applied to the "0" program operation, for example, a predetermined voltage VL lower than the voltage VH may be set. That is, when the threshold voltage of the memory cell transistor MT is less than the voltage VL (in the "Er1" state in FIG. 6), the first program condition is applied to the memory cell transistor MT. When the threshold voltage of the memory cell transistor MT is equal to or higher than the voltage VL and less than the voltage VH (in the "Er2" state in FIG. 6), in the next program operation, the second program condition is applied to the memory cell transistor MT.

1.2.2 Regarding Verification Operation

Next, an example of the verification operation according to the embodiment will be described.

1.2.2.1 Sensing Operation

As described above, either the first program condition or the second program condition can be applied to the "0" program operation according to the embodiment, depending on the difference between the threshold voltage of the memory cell transistor MT and the target state. While determining whether the "0" program operation is applied or the "1" program operation is applied to the next program operation, the verification operation according to the embodiment also determines whether the first program condition has been applied or the second program condition has been applied.

In the following description, in the verification operations, an operation of determining whether or not to apply the first program condition of the "0" program operation to the next program operation is referred to as a first sensing operation. In the verification operations, an operation of determining whether to apply the "1" program operation to the memory cell transistor MT to which the first program condition of the "0" program operation is determined to not be applied, or of determining whether to apply the second program condition of the "0" program operation thereto is referred to as a second sensing operation.

That is, the first sensing operation is an operation corresponding to the determination of whether or not the threshold voltage of the memory cell transistor MT has reached the voltage VL, and the second sensing operation is an operation corresponding to the determination of whether or not the threshold voltage of the memory cell transistor MT whose threshold voltage has reached the voltage VL, has also reached the voltage VH.

Figure 7:
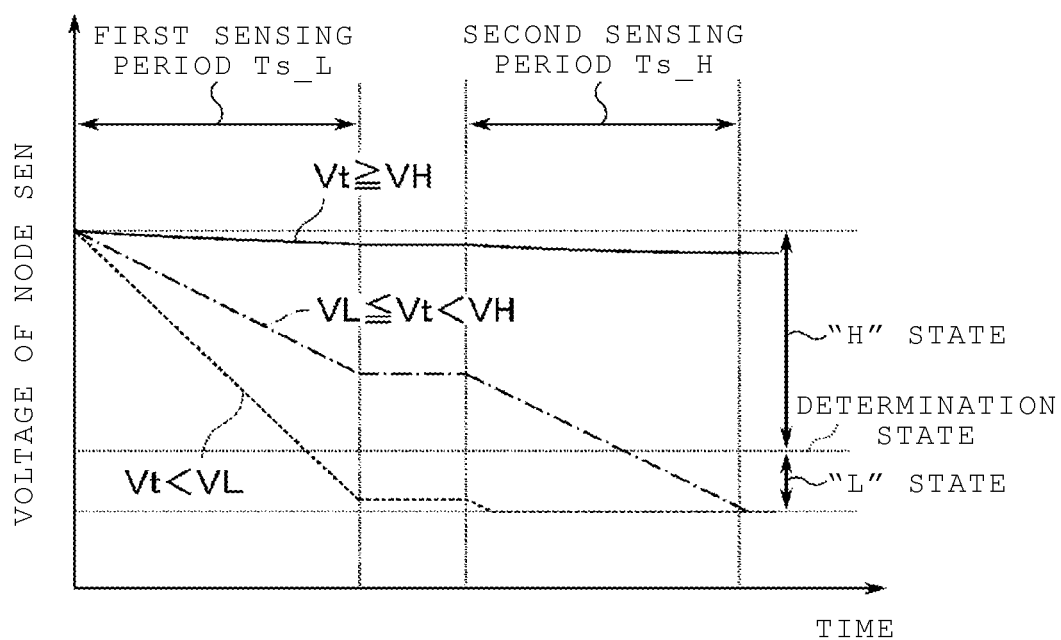
FIG. 7 is a diagram illustrating a first sensing operation and a second sensing operation in a verification operation using the semiconductor storage device according to the embodiment.

FIG. 7 is a diagram illustrating the first sensing operation and the second sensing operation in the verification operation.

In FIG. 7, a voltage of the node SEN corresponding to the memory cell transistor MT which becomes a target of the "1" program operation is indicated with a solid line. Voltages of the node SEN corresponding to the memory cell transistor MT, which becomes a target of the "0" program operation, to which the first program condition and the second program condition are applied are respectively indicated with a broken line and an alternate long and short dash line.

As illustrated in FIG. 7, according to the embodiment, in the verification operation, while the voltage VH is applied to the word line WL, a charge of the node SEN is transferred to the bit line BL in two periods. Of the two periods, a first period (a first sensing period Ts_L in FIG. 7) corresponds to the first sensing operation, and a second period (a second sensing period Ts_H in FIG. 7) corresponds to the second sensing operation.

When the charge of the node SEN is transferred to the bit line BL during the sensing period, the voltage of the node SEN decreases. At this time, a speed at which the voltage of the node SEN decreases is different depending on the threshold voltage Vt of the memory cell transistor MT. For example, when the threshold voltage Vt is less than the voltage VL (Vt<VL), the memory cell transistor MT goes into a strong ON state, and the voltage of the node SEN (the broken line in FIG. 7) sharply decreases. When the threshold voltage Vt is equal to or higher than the voltage VL and less than the voltage VH (VL≤Vt<VH), the memory cell transistor MT goes into a weak ON state, and the voltage of the node SEN (the alternate long and short dash line in FIG. 7) gradually decreases. When the threshold voltage Vt is equal to or higher than the voltage VH (Vt VH), the memory cell transistor MT goes into an OFF state, and the voltage of the node SEN (the solid line in FIG. 7) decreases very gradually.

Based upon this relationship, a length of the first sensing period Ts_L is set so that the voltage of the node SEN corresponding to the memory cell transistor MT whose threshold voltage Vt is less than the voltage VL falls below a predetermined determination state, and the voltage of the node SEN corresponding to the memory cell transistor MT whose threshold voltage Vt is equal to or higher than the voltage VL remains greater than the determination state. A length of the second sensing period Ts_H is set so that the voltage of the node SEN corresponding to the memory cell transistor MT whose threshold voltage Vt is less than the voltage VH falls below the determination state, and the voltage of the node SEN corresponding to the memory cell transistor MT whose threshold voltage Vt is equal to or higher than the voltage VH remains greater than the determination state. The predetermined determination state is, for example, the threshold voltage of the transistor 37 illustrated in FIG. 4, and whether or not the voltage of the node SEN exceeds the determination state corresponds to whether or not the transistor 37 goes into the ON state according to the voltage of the node SEN.

The sense amplifier 4 determines whether or not the voltage of the node SEN falls below the determination state at the end of the first sensing period Ts_L (that is, before the second sensing period Ts_H). Accordingly, in the verification operation of applying the voltage VH to the word line WL, it is possible to determine whether or not the memory cell transistor MT falls below the threshold voltage VL (that is, to determine whether or not to apply the "0" program operation of the first program condition). The sense amplifier 4 determines again whether or not the voltage of the node SEN falls below the determination state at the end of the second sensing period Ts_H. Accordingly, it is possible to determine whether or not the memory cell transistor MT, which is determined to be equal to or higher than the threshold voltage VL by the first sensing operation, falls below the threshold voltage VH (that is, to determine whether to apply the "0" program operation to which the second program condition is applied, or whether to apply the "1" program operation).

1.2.3 Regarding Timing Chart

Next, a voltage of each wiring in the above-mentioned write operation will be described.

1.2.3.1 Regarding Timing Chart During Verification Operation

Figure 8:
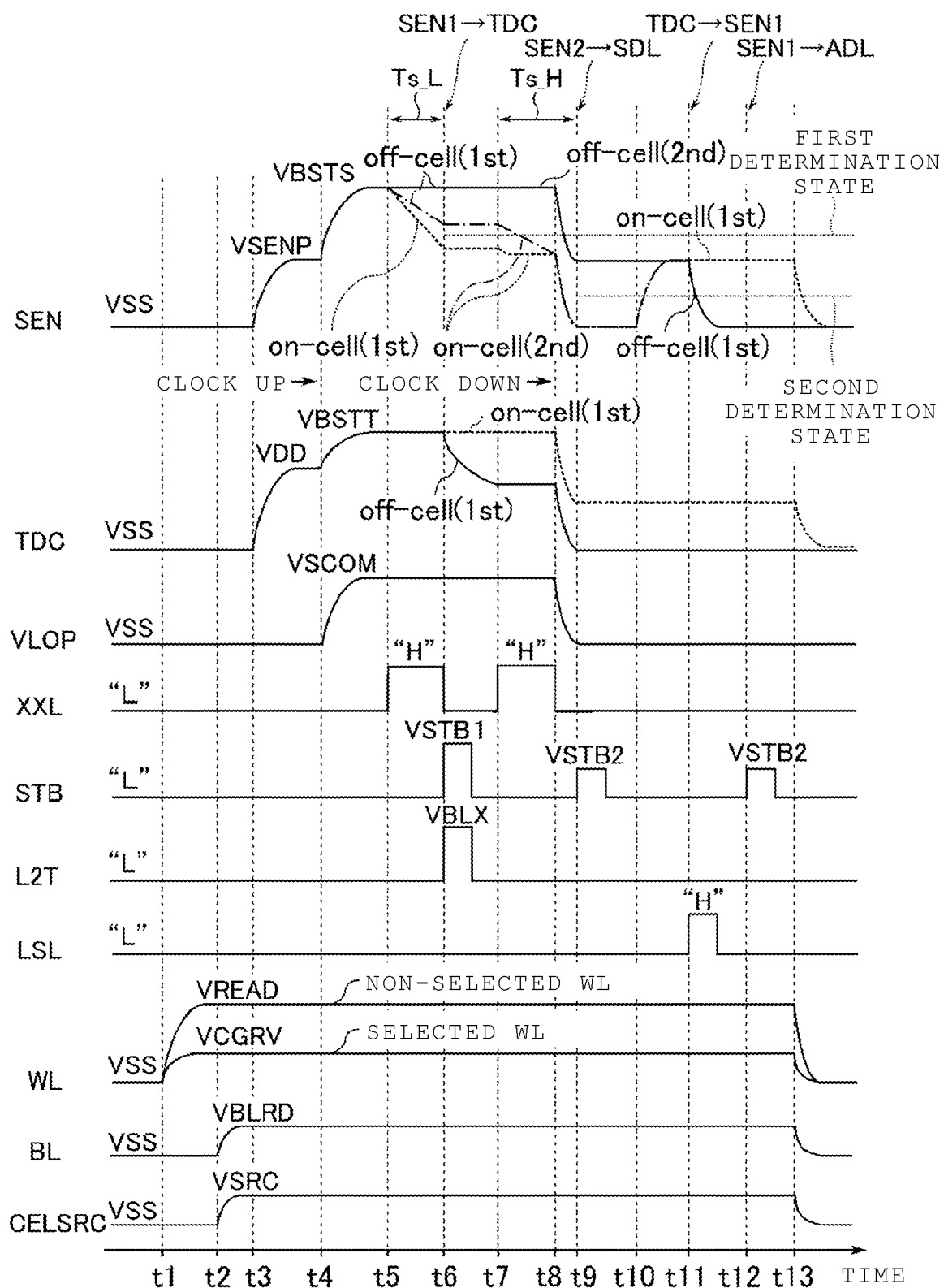
FIG. 8 is a timing chart illustrating a voltage of various wirings during the verification operation using the semiconductor storage device according to the embodiment.

A voltage of each wiring during the verification operation will be described with reference to FIG. 8. FIG. 8 is a timing chart illustrating voltages of each wiring, the bit line BL, and the word line WL in the sense amplifier during the verification operation.

In the voltage of the node SEN and the node TDC in FIG. 8, a solid line indicates a voltage corresponding to the memory cell transistor MT which becomes the target of the "1" program operation. A broken line indicates a voltage corresponding to the memory cell transistor MT which becomes the target of the "0" program operation to which the first program condition is applied. An alternate long and short dash line indicates a voltage corresponding to the memory cell transistor MT which becomes the target of the "0" program operation to which the second program condition is applied.

At time t1, the row decoder 3 applies a voltage VCGRV to the selected word line WL and a voltage VREAD to the non-selected word line WL. The voltage VCGRV corresponds to, for example, the voltage VH. The row decoder 3 turns on the select transistors ST1 and ST2.

At time t2, the sense amplifier 4 performs BL pre-charging of the bit line BL, and applies a voltage VBLRD to the bit line BL. The voltage VBLRD is a voltage applied to the bit line BL during the verification operation. A voltage VSRC (>VSS) is applied to the source line CELSRC, for example, via a source line driver which is not illustrated.

At time t3, the control circuit 5 sets the signal HLL to an "H" state and turns on the transistor 35. Accordingly, the voltage VSENP is applied to the node SEN in the sense amplifier unit SAU.

The control circuit 5 sets the signal LPC to the "H" state, turns on the transistor 41, and applies the power supply voltage VDD to the other end of the current path of the transistor 41. The control circuit 5 sets the signal L2T to the "H" state, and turns on the transistor 42. Accordingly, the voltage VDD is transferred to the bus LBUS and the node TDC, and the bus LBUS and the node TDC are pre-charged.

The verification operation is executed at time t4 to time t10.

More specifically, at the time t4, the control circuit 5 applies a voltage at the "H" state to the clock signal CLKSA. As a result, the capacitive element 44 is charged, and the voltage of the node SEN rises (hereinafter, also referred to as "clock up") to a voltage VBSTS due to an influence of capacitive coupling.

The control circuit 5 sets the power supply voltage VLOP to a voltage VSCOM. The voltage VSCOM is a voltage higher than the voltage VSS. Accordingly, source voltages of the transistors 37 and 39 become the voltage VSCOM.

The control circuit 5 applies the voltage at the "H" state to the clock signal CLKTD. As a result, the capacitive element 45 is charged, and the voltage of the node TDC rises (clocks up) to a voltage VBSTT due to the influence of the capacitive coupling. The voltage VBSTT is a voltage higher than the voltage VSCOM.

During the period of the time t5 and the time t6, the control circuit 5 executes the first sensing operation. More specifically, during the time t5 and the time t6, the control circuit 5 sets the signal XXL from the "L" state to the "H" state, and turns on the transistor 34. In this state, when the threshold voltage of the memory cell transistor MT which becomes a target of the verification operation is equal to or higher than the voltage VH, the memory cell transistor MT goes into the OFF state, and no current or a marginal amount of current flows from the corresponding bit line BL to the source line CELSRC. When the threshold voltage of the memory cell transistor MT is equal to or higher than the voltage VL and less than the voltage VH, the memory cell transistor MT goes into the weak ON state, and a small amount of current flows from the corresponding bit line BL to the source line CELSRC. Therefore, when the threshold voltage of the memory cell transistor MT is equal to or higher than the voltage VL (off-cell (1st) in FIG. 8), charges at the node SEN and the capacitive element 44 are barely discharged, and a voltage allowing the transistor 37 to go into the ON state (hereinafter, also simply referred to as the "H" state) is maintained. On the other hand, when the threshold voltage of the memory cell transistor MT which becomes the target of the verification operation is less than the voltage VL (on-cell (1st) in FIG. 8), the memory cell transistor MT goes into the strong ON state, and a significant amount of current flows from the corresponding bit line BL to the source line CELSRC. Accordingly, the voltage of the node SEN drops to a voltage allowing the transistor 37 to go into the OFF state (hereinafter, also simply referred to as the "L" state).

At the time t6, the control circuit 5 sets the signal XXL to the "L" state, and allows the transistor 34 to go into the OFF state. The control circuit 5 applies a voltage VSTB1 to the signal STB to allow the transistor 38 to go into the ON state, and strobes the voltage of the node SEN. The voltage VSTB1 is a voltage allowing the transistor 38 to go into the ON state in a state where the voltage VSCOM is applied to the node LOP. The control circuit 5 inputs the signal L2T and applies a voltage VBLX to the gate of the transistor 42. The voltage VBLX is a voltage that turns on the transistor 42 when the voltage VSCOM is applied to the bus LBUS, and that cuts off the transistor 42 when the voltage VDD is applied to the bus LBUS, in a state where the voltage of the node TDC rises to the voltage VBSTT.

In this state, when the voltage of the node SEN is maintained at the "H" state (equal to or higher than the first determination state in FIG. 8), the transistor 37 enters an ON state. Accordingly, the voltage of the bus LBUS drops from the voltage VDD after being pre-charged, to the voltage VSCOM, and the transistor 42 goes into the ON state. Therefore, the voltage of the node TDC drops from the voltage VBSTT after being clocked up, to the voltage VSCOM (voltage at the "L" state).

On the other hand, when the voltage of the node SEN drops to the "L" state (less than the first determination state in FIG. 8), the transistor 37 goes into the OFF state. Accordingly, the voltage of the bus LBUS is maintained at the voltage VDD after being pre-charged, and the transistor 42 is maintained at the OFF state. Therefore, the voltage of the node TDC is maintained at the voltage VBSTT after being clocked up (voltage at the "H" state).

As described above, when the transistor 37 goes into the ON state (or goes into the OFF state) in the first sensing operation, the data based upon the voltage of the node SEN (hereinafter, also referred to as first data) is determined to be at the "H" state (or the "L" state). When the data in the node SEN is at the "H" state, the node TDC goes into the "L" state, and when the data in the node SEN is at the "L" state, the node TDC is maintained at the "H" state. Accordingly, the first data is stored in the node TDC. In FIG. 8, the node SEN in which the first data is stored is defined as SEN1, and the timing at which storage of the above-described data is executed is indicated as SEN1→TDC.

At the time t7, the control circuit 5 applies the power supply voltage VDD to the other end of the current path of the transistor 41, and pre-charges the bus LBUS.

During the period from the time t7 to the time t9, the control circuit 5 executes the second sensing operation following the first sensing operation at the time t5 and the time t6. When the threshold voltage of the memory cell transistor MT which becomes the target of the verification operation is equal to or higher than the voltage VH, the memory cell transistor MT goes into the OFF state (off-cell (2nd) in FIG. 8), and the voltage of the node SEN maintains the "H" state. On the other hand, when the threshold voltage of the memory cell transistor MT which becomes the target of the verification operation is less than the voltage VH, the memory cell transistor MT goes into the ON state (on-cell (2nd) in FIG. 8), and the voltage of the node SEN drops to the "L" state.

At the time t8, the control circuit 5 sets the signal XXL to the "L" state and clocks down the voltages of the nodes SEN and TDC. The power supply voltage VLOP drops from the voltage VSCOM to the voltage VSS. Accordingly, the source voltages of the transistors 37 and 39 become the voltage VSS.

Here, when the threshold voltage of the memory cell transistor MT which becomes the target of the verification operation is equal to or higher than the voltage VH, the voltage of the node SEN after being clocked down maintains a voltage (that is, at the "H" state) allowing the transistor 37 to go into the ON state. On the other hand, when the threshold voltage of the memory cell transistor MT is less than the voltage VH, the voltage of the node SEN after being clocked down maintains a voltage (that is, at the "L" state) allowing the transistor 37 to go into the OFF state.

When the first data stored in the node TDC is at the "H" state, the voltage of the node TDC after being clocked down maintains a voltage (that is, at the "H" state) allowing the transistor 39 to go into the ON state. On the other hand, when the first data stored in the node TDC is at the "L" state, the voltage of the node TDC after being clocked down maintains a voltage (that is, at the "L" state) allowing the transistor 39 to go into the OFF state.

At the time t9, the control circuit 5 applies a voltage VSTB2 to the signal STB, and strobes the voltage of the node SEN. When the voltage of the node SEN is at the "H" state (equal to or higher than the second determination state in FIG. 8), the transistor 37 goes into the ON state. Accordingly, the bus LBUS drops from the voltage VDD to the voltage VSS (the "L" state). On the other hand, when the voltage of the node SEN is lower than the second determination state (less than the second determination state in FIG. 8) which is at the "L" state, the corresponding sense transistor 37 goes into the OFF state. Accordingly, the bus LBUS maintains the voltage VDD (the "H" state).

As described above, when the transistor 37 goes into the ON state (or goes into the OFF state) in the second sensing operation, the data based upon the voltage of the node SEN (hereinafter, also referred to as the second data) is determined to be at the "H" state (or the "L" state). When the data of the node SEN is at the "H" state, the bus LBUS goes into the "L" state, and the state is transferred to the node LAT_S of the latch circuit SDL. When the data of the node SEN is at the "L" state, the node LBUS is maintained at the "H" state, and the "H" state is transferred to the node LAT_S of the latch circuit SDL. Accordingly, the second data is stored in the latch circuit (for example, the latch circuit SDL) via the bus LBUS. In FIG. 8, the node SEN in which the second data is stored is defined as SEN2, and the timing at which storage of the above-described data is executed is indicated as SEN2→SDL.

At the time t10, the control circuit 5 sets the signal HLL to the "H" state, and applies the voltage VSENP to the node SEN.

At time t11, the control circuit 5 sets the signal LSL from the "L" state to the "H" state to allow the transistor 40 to go into the ON state, and strobes the voltage of the node TDC. As described above, when the data of the node TDC is at the "H" state, the transistor 39 goes into the ON state, and the voltage of the node SEN drops from the voltage VSENP to the voltage VSS (voltage at the "L" state). When the data of the node TDC is at the "L" state, the transistor 39 goes into the OFF state, and the voltage of the node SEN is maintained at the voltage VSENP (voltage at the "H" state). Accordingly, the inverted data of the first data stored in the node TDC is transferred to the node SEN. In FIG. 8, the timing at which storage of the above-described data is executed is indicated as TDC→SEN1.

The control circuit 5 applies the power supply voltage VDD to the other end of the current path of the transistor 41, and pre-charges the bus LBUS.

At time t12, the control circuit 5 applies the voltage VSTB2 to the signal STB to allow the transistor 38 to go into the ON state, and strobe the voltage of the node SEN. The voltage VSTB2 is a voltage allowing the transistor 38 to go into the ON state in a state where the voltage VSS is applied to the node LOP, and is lower than, for example, the voltage VSTB1. When the voltage of the node SEN is at the "H" state, the transistor 37 goes into the ON state. Accordingly, the bus LBUS drops from the voltage VDD to the voltage VSS (the "L" state). On the other hand, when the voltage of the node SEN is at the "L" state, the transistor goes into the OFF state. Accordingly, the bus LBUS maintains the voltage VDD (the "H" state).

As described above, when the data of the node SEN is at the "H" state, the bus LBUS goes into the "L" state, and the "L" state is transferred to a node LAT_A of the latch circuit ADL. When the data of the node SEN is at the "L" state, the node LBUS is maintained at the "H" state, and the "H" state is transferred to the node LAT_A of the latch circuit ADL. Accordingly, the first data is stored in the latch circuit (for example, the latch circuit ADL) via the bus LBUS. In FIG. 8, the timing at which storage of the above-described data is executed is indicated as SEN1→ADL.

At time t13, a recovery process is performed and the verification operation is completed.

The sense amplifier 4 determines the difference between the target state and the threshold voltage of the memory cell transistor MT, based upon the first data and the second data respectively stored in the latch circuits ADL and SDL. Next, according to the determined result, any one of the first program condition of the "0" program operation, the second program condition of the "0" program operation, and the "1" program operation is applied to the next program operation.

As described above, the verification operation is completed.

1.2.3.2 Regarding Timing Chart During Program Operation

Next, a voltage of each wiring during the program operation will be described with reference to FIG. 9. FIG. 9 is a timing chart illustrating a voltage of each wiring during the program operation using the semiconductor storage device according to the embodiment. In a voltage of the bit line BL illustrated in an upper stage of FIG. 9, a solid line corresponds to a bit line BL corresponding to the memory cell transistor MT which becomes the target of the "1" program operation (hereinafter, referred to as a bit line BL ("1")). A broken line corresponds to a bit line BL corresponding to the memory cell transistor MT which becomes the target of the "0" program operation to which the first program condition is applied (hereinafter, referred to as a bit line BL ("0")). An alternate long and short dash line corresponds to a bit line BL corresponding to the memory cell transistor MT which becomes the target of the "0" program operation to which the second program condition is applied (hereinafter, referred to as a bit line BL ("QPW")).

As illustrated in FIG. 9, at time t20, the sense amplifier 4 performs BL pre-charging based upon the data stored in the latch circuit SDL. More specifically, when the memory cell transistor MT becomes the target of the "1" program operation (that is, the node SEN2 is at the "H" state), the node LAT_S of the corresponding latch circuit SDL is at the "L" state, so that the transistor 43 goes into the ON state. In this state, the signals BLS and BLX are set to the "H" state, and the transistors 30 and 32 go into the ON state. Next, when the signal BLC is set to the "H" state and a voltage "VBL+Vt31" (Vt31 is a threshold voltage of the transistor 31) is applied to the gate of the transistor 31, a voltage VBL is applied to the bit line BL. That is, the voltage VBL is applied to the bit line BL ("1"). On the other hand, when the memory cell transistor MT becomes the target of the "0" program operation (that is, the node SEN2 is at the "L" state), the node LAT_S is at the "H" state, so that the transistor 33 goes into the ON state. When the voltage VSS is applied to the node SRCGND, the voltage VSS is applied to the corresponding bit line BL. That is, the voltage VSS is applied to the bit line BL ("0") and the bit line BL ("QPW").

The row decoder 3 selects any one of the blocks BLK, and further selects any one of the string units SU. Next, the row decoder 3 applies a voltage VSD1 to the select gate line SGD in the selected string unit SU. On the assumption that the threshold voltage of the select transistor ST1 is Vtsg, the voltage VSD1 is a voltage equal to or higher than "VBL+ Vtsg", and is a voltage allowing the select transistor ST1 to go into the ON state. On the other hand, the row decoder 3 applies the voltage VSS to the select gate line SGD in the non-selected string unit SU, and allows the corresponding select transistor ST1 to go into the OFF state. The row decoder 3 applies the voltage VSS to the select gate line SGS, and allows the select transistor ST2 to go into the OFF state.

A voltage VCELSRC (>VSS) is applied to a source line SL, for example, via a source line driver which is not illustrated.

Accordingly, the voltage VBL is applied to the channel of the selected NAND string 6 corresponding to the bit line BL ("1"), and the voltage VSS is applied to the channel of the selected NAND string 6 corresponding to the bit lines BL ("0") and BL ("QPW").

At time t21, the row decoder 3 reduces the voltage applied to the select gate line SGD in the selected string unit SU from the voltage VSD1 to a voltage VSD2. The voltage VSD2 is a voltage lower than the voltage VSD1 and the voltage VBL, and is a voltage that turns on the select transistor ST1 in which the voltage VSS is applied to the bit line BL, and that cuts off the select transistor ST1 in which the voltage VBL is applied to the bit line BL. Accordingly, the channel of the NAND string 6 corresponding to the bit line BL ("1") goes into a floating state. The sense amplifier 4 sets the voltage at the "H" state of the signal BLC to "VQPW+Vt31" in the transistor 31 in the sense amplifier unit SAU. The voltage VQPW is a voltage higher than the voltage VSS and lower than the voltage VBL (VSS<VQPW<VBL). Accordingly, in the sense amplifier unit SAU corresponding to the bit line BL ("1") to which the voltage VBL is applied, the transistor 31 goes into the cutoff state, and the bit line BL ("1") also goes into the floating state.

At time t22, the sense amplifier 4 updates the data of the latch circuit SDL in order to apply either the first program condition or the second program condition to the bit line BL. More specifically, the data stored in the node LAT_S of the latch circuit SDL is updated to the data (first data) stored in the node LAT_A of the latch circuit ADL in the verification operation. In the sense amplifier unit SAU corresponding to the bit line BL ("QPW"), the node LAT_S of the latch circuit SDL is updated from the "H" state to the "L" state. Therefore, the sense amplifier 4 applies the voltage VQPW clamped by the transistor 31 to the bit line BL ("QPW").

As described above, the voltage VSS is applied to the bit line BL corresponding to the first program condition. Next, the voltage VQPW higher than the voltage VSS is applied to the bit line BL corresponding to the second program condition. By changing the voltage of the bit line BL in this manner, in the same program operation, the "0" program operation to which the first program condition is applied, the "0" program operation to which the second program condition is applied, and the "1" program operation can be set for each bit line BL.

At time t23, the row decoder 3 selects any one of the word lines WL in the selected block BLK, applies a voltage VPGM to the selected word line, and applies the voltage VPASS to other non-selected word lines WL.

In the NAND string 6 corresponding to the bit line BL ("0"), the select transistor ST1 goes into the ON state. Next, a channel voltage of the memory cell transistor MT connected to the selected word line WL becomes VSS. Therefore, a voltage difference (VPGM-VSS) between the control gate and the channel becomes large. As a result, electrons are injected into the charge storage layer, and the threshold voltage of the memory cell transistor MT rises.

In the NAND string 6 corresponding to the bit line BL ("1"), the select transistor ST1 goes into the cutoff state. Therefore, the channel of the memory cell transistor MT connected to the selected word line WL becomes electrically floating. Consequently, the channel voltage rises by the capacitive coupling with the word line WL. Accordingly, the voltage difference between the control gate and the channel becomes small. As a result, electrons are barely injected into the charge storage layer, and the threshold voltage of the memory cell transistor MT is maintained (the threshold voltage does not fluctuate as the threshold voltage distribution state transitions to a higher distribution).

In the NAND string 6 corresponding to the bit line BL ("QPW"), the select transistor ST1 goes into the ON state. Next, the channel voltage of the memory cell transistor MT connected to the selected word line WL becomes VQPW (>VSS). Accordingly, the voltage difference (VPGM-VQPW) between the control gate and the channel becomes smaller than a case where the channel voltage is VSS. As a result, the amount of electrons injected into the charge storage layer is smaller than that of the memory cell transistor MT corresponding to the bit line BL ("0"), so that the amount of increase in the threshold voltage of the memory cell transistor MT is also smaller.

At time t24, the sense amplifier 4 applies the voltage VSS to the bit line BL. The row decoder 3 applies the voltage VSS to all the word lines WL. Accordingly, the injection of charges into the charge storage layer is completed.

At time t25, the row decoder 3 applies the voltage VSS to the select gate line SGD. The application of the voltage VCELSRC to the source line SL is stopped, and the voltage VSS is applied to the source line SL.

As described above, the program operation is completed.

1.3 Regarding Effect According to the Embodiment

According to the embodiment, a read speed of the semiconductor storage device, e.g., during a program verify operation, can be improved. An effect of the embodiment will be described below.

According to the embodiment, in the operation of continuously reading the first data and the second data while the voltage VH is applied to the word line WL, the sense amplifier 4 determines the first data in a state where the node SEN is clocked up (without performing clock-down). Accordingly, it is not necessary to perform the clock-up again in order to perform the second sensing operation. Therefore, the operation of performing the clock-up again is omitted before the second sensing operation, the time required for performing the clock-up and the time until the voltage of the node SEN after performing the clock-up is stabilized can be omitted. Therefore, the read speed during a program verify operation can be improved.

The sense amplifier 4 can store the data in the node TDC by including the transistor 42 between the bus LBUS and the node TDC. Accordingly, the determination result can be transferred to the node TDC when determining the first data.

More specifically, when the first data is transferred to the node TDC, the transistor 42 is controlled so as to go into the OFF state when the voltage of the bus LBUS is the voltage VDD, and go into the ON state when the voltage thereof is the voltage VSCOM. As a result, the transistor 42 can go into the ON state (or go into the OFF state) according to the fact that the transistor 37 goes into the ON state (or goes into the OFF state). Therefore, it is possible to transfer the first data to the node TDC via the transistors 37 and 42.

The voltage VSCOM is applied to the node LOP while the nodes SEN and TDC are clocked up, and the voltage VSS is applied to the node LOP while the nodes SEN and TDC are clocked down. Accordingly, when the first data is transferred to the node TDC, which is executed while the nodes SEN and TDC are clocked up, the voltage VSTB1 is applied to the gate of the transistor 38. On the other hand, when the first data is transferred to the latch circuit ADL, which is executed while the nodes SEN and TDC are clocked down, the voltage VSTB2 lower than the voltage VSTB1 is applied to the gate of the transistor 38. Accordingly, regardless of whether the node SEN is clocked up, a voltage at an appropriate "H" state can be applied to the transistor 38, and in either case, the voltage of the node SEN can be strobed.

2. Others

The "connection" in the embodiment also includes a state of being indirectly connected by interposing something else such as a transistor or a resistor therebetween.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a bit line;
   a memory cell transistor electrically connected to the bit line; and
   a sense amplifier configured to read data from the memory cell transistor via the bit line, the sense amplifier including
   a first capacitive element having an electrode connected to a first node connectable to the bit line,
   a first transistor having a gate connected to the first node, a first end connected to a second node, and a second end connectable to a third node,
   a second transistor between the third node and a fourth node,
   a third transistor having a gate connected to the fourth node, a first end connected to the second node, and a second end connectable to the first node,
   a second capacitive element having an electrode connected to the fourth node, and
   a first latch circuit and a second latch circuit connected to the third node,
   wherein during an operation of determining first data and second data, while continuously applying a first voltage to a gate of the memory cell transistor, the sense amplifier first determines the first data based upon a second voltage, and then determines the second data based upon a third voltage lower than the second voltage.

2. The semiconductor storage device according to claim 1, wherein
   the first node is connected to the bit line through a plurality of transistors;
   the second end of the first transistor is connected to the third node through a fourth transistor; and
   the second end of the third transistor is connectable to the first node through a fifth transistor.

3. The semiconductor storage device according to claim 1, wherein the sense amplifier, during the operation, transfers a voltage corresponding to the first data to the fourth node via the first transistor and the second transistor before determining the second data.

4. The semiconductor storage device according to claim 3, wherein
   the sense amplifier, during the operation, sets the third node to a fourth voltage higher than the second voltage, and applies a fifth voltage to a gate of the second transistor, when transferring the voltage corresponding to the first data to the fourth node, and
   the fifth voltage is set so that the second transistor goes into an ON state when a voltage of the third node drops from the fourth voltage to the second voltage, and the second transistor goes into an OFF state when the voltage of the third node is maintained at the fourth voltage.

5. The semiconductor storage device according to claim 4, wherein the sense amplifier, during the operation, transfers a voltage corresponding to the second data to the first latch circuit via the first transistor and the third node after transferring the voltage corresponding to the first data to the fourth node.

6. The semiconductor storage device according to claim 5, wherein the sense amplifier, during the operation, sets a voltage of the second node to the second voltage when determining the first data, and to set the voltage of the second node to the third voltage when transferring the voltage corresponding to the second data to the first latch circuit.

7. The semiconductor storage device according to claim 6, wherein
   the sense amplifier further includes a fourth transistor having a first end connected to the second end of the first transistor and a second end connected to the third node, and
   the sense amplifier, during the operation, applies a sixth voltage to a gate of the fourth transistor when transferring the voltage corresponding to the first data to the fourth node, and applies a seventh voltage lower than the sixth voltage to the gate of the fourth transistor when transferring the voltage corresponding to the second data to the first latch circuit.

8. The semiconductor storage device according to claim 7, wherein the sense amplifier, during the operation, transfers the voltage corresponding to the first data transferred to the fourth node to the first node via the third transistor after transferring the voltage corresponding to the second data to the first latch circuit.

9. The semiconductor storage device according to claim 8, wherein the sense amplifier, during the operation, transfers the voltage corresponding to the first data transferred to the first node to the second latch circuit via the first transistor and the third node.

10. In a semiconductor storage device including a bit line, a memory cell transistor electrically connected to the bit line, and a sense amplifier, a method of determining data stored in the memory cell transistor using the sense amplifier, comprising:
- while continuously applying a first voltage to a gate of the memory cell transistor, determining first data based upon a second voltage, and then determining second data based upon a third voltage lower than the second voltage, wherein the sense amplifier includes
  - a first capacitive element having an electrode connected to a first node connectable to the bit line,
  - a first transistor having a gate connected to the first node, a first end connected to a second node, and a second end connectable to a third node,
  - a second transistor between the third node and a fourth node,
  - a third transistor having a gate connected to the fourth node, a first end connected to the second node, and a second end connectable to the first node,
  - a second capacitive element having an electrode connected to the fourth node, and
  - a first latch circuit and a second latch circuit connected to the third node.

11. The method according to claim 10, wherein
- the first node is connected to the bit line through a plurality of transistors;
- the second end of the first transistor is connected to the third node through a fourth transistor; and
- the second end of the third transistor is connectable to the first node through a fifth transistor.

12. The method according to claim 10, further comprising:
- transferring a voltage corresponding to the first data to the fourth node via the first transistor and the second transistor before determining the second data.

13. The method according to claim 12, further comprising:
- setting the third node to a fourth voltage higher than the second voltage, and applying a fifth voltage to a gate of the second transistor, when transferring the voltage corresponding to the first data to the fourth node, wherein the fifth voltage is set so that the second transistor goes into an ON state when a voltage of the third node drops from the fourth voltage to the second voltage, and the second transistor goes into an OFF state when the voltage of the third node is maintained at the fourth voltage.

14. The method according to claim 13, further comprising:
- transferring a voltage corresponding to the second data to the first latch circuit via the first transistor and the third node after transferring the voltage corresponding to the first data to the fourth node.

15. The method according to claim 14, further comprising:
- setting a voltage of the second node to the second voltage when determining the first data, and setting the voltage of the second node to the third voltage when transferring the voltage corresponding to the second data to the first latch circuit.

16. The method according to claim 15, wherein the sense amplifier further includes a fourth transistor having a first end connected to the second end of the first transistor and a second end connected to the third node, said method further comprising:
- applying a sixth voltage to a gate of the fourth transistor when transferring the voltage corresponding to the first data to the fourth node, and applying a seventh voltage lower than the sixth voltage to the gate of the fourth transistor when transferring the voltage corresponding to the second data to the first latch circuit.

17. The method according to claim 16, further comprising:
- transferring the voltage corresponding to the first data transferred to the fourth node to the first node via the third transistor after transferring the voltage corresponding to the second data to the first latch circuit.

18. The method according to claim 17, further comprising:
- transferring the voltage corresponding to the first data transferred to the first node to the second latch circuit via the first transistor and the third node.

* * * * *